United States Patent
Ahn et al.

(10) Patent No.: US 11,361,575 B2
(45) Date of Patent: Jun. 14, 2022

(54) ELECTRONIC DEVICE USING PIEZOELECTRIC MATERIAL AND MANUFACTURING METHOD THEREOF

(71) Applicant: POINT ENGINEERING CO., LTD., Asan (KR)

(72) Inventors: Bum Mo Ahn, Suwon (KR); Seung Ho Park, Hwaseong (KR); Tae Hwan Song, Cheonan (KR)

(73) Assignee: POINT ENGINEERING CO., LTD., Asan (KR)

( * ) Notice: Subject to any disclaimer, the term of this patent is extended or adjusted under 35 U.S.C. 154(b) by 468 days.

(21) Appl. No.: 16/416,003

(22) Filed: May 17, 2019

(65) Prior Publication Data
US 2019/0362118 A1  Nov. 28, 2019

(30) Foreign Application Priority Data
May 23, 2018  (KR) .................. 10-2018-0058224

(51) Int. Cl.
| | |
|---|---|
| *H01L 41/187* | (2006.01) |
| *H01L 41/113* | (2006.01) |
| *H01L 41/047* | (2006.01) |
| *G06V 40/13* | (2022.01) |
| *B06B 1/06* | (2006.01) |

(52) U.S. Cl.
CPC ............ *G06V 40/1306* (2022.01); *B06B 1/06* (2013.01); *H01L 41/0472* (2013.01); *H01L 41/113* (2013.01); *H01L 41/187* (2013.01)

(58) Field of Classification Search
CPC ..... B06B 1/06; H01L 41/0472; H01L 41/113; H01L 41/187
USPC ........................................ 310/334
See application file for complete search history.

(56) References Cited

U.S. PATENT DOCUMENTS

2006/0238077 A1 * 10/2006 Scott .................. G06V 40/1306
310/334

FOREIGN PATENT DOCUMENTS

| JP | H0812181 B2 | 2/1996 |
|---|---|---|
| JP | 2617584 B2 | 6/1997 |
| KR | 101288178 B1 | 7/2013 |

* cited by examiner

*Primary Examiner* — Derek J Rosenau

(57) ABSTRACT

Disclosed are a piezoelectric material-based electronic device having high recognition precision for a three-dimensional shape and improved durability, and a manufacturing method thereof. The electronic device includes an anodic oxide film, a first electrode provided on an upper surface of the anodic oxide film, a second electrode provided on an a lower surface of the anodic oxide film, and a piezoelectric column made of a piezoelectric material and provided between the first electrode and the second electrode.

11 Claims, 10 Drawing Sheets

ELECTRONIC DEVICE USING PIEZOELECTRIC MATERIAL AND MANUFACTURING METHOD THEREOF

CROSS REFERENCE TO RELATED APPLICATION

The present application claims priority to Korean Patent Application No. 10-2018-0058224 (filed May 23, 2018), the entire contents of which is incorporated herein for all purposes by this reference.

BACKGROUND OF THE DISCLOSURE

1. Field of the Disclosure

The present invention relates to an electronic device using a piezoelectric material and a method of manufacturing the same.

2. Description of the Background Art

An electronic device using a piezoelectric material refers to a three-dimensional object image measuring device in which a voltage is applied across electrodes provided respectively on the upper surface and the lower surface of a piezoelectric column made of a piezoelectric material to vibrate the piezoelectric column up and down to generate a measurement signal, the measurement signal travels to a three-dimensional object and reflects off the three-dimensional object to generate a return signal, and the return signal is detected to measure an electric potential attributable to deformation of the piezoelectric column. A piezoelectric column in an electronic device using a piezoelectric material functions as an image pixel of an image of a three-dimensional object.

A conventional method of manufacturing a piezoelectric column includes a process of manufacturing a semiconductor substrate or a resin mold and a process of forming holes to be filled with a piezoelectric material using a photolithography technique. Next, the holes are filled with a piezoelectric material to form piezoelectric columns.

A piezoelectric column generally transmits and receives ultrasonic waves in all directions including a transverse direction. The ultrasonic waves emitted from the side surface of a piezoelectric column are directly received by the adjacent piezoelectric column, thereby acting as a noise signal on the adjacent piezoelectric column. In order to remove such noise, the characteristic of the peripheral portion surrounding a piezoelectric column is important. In other words, a peripheral portion surrounding a piezoelectric column must effectively remove the noise by attenuating the sound waves propagated from the side surface of the piezoelectric column. To this end, synthetic resin, polymer, and epoxy have been suggested as the material of the peripheral portion. However, these materials have limitations in increasing the efficiency of attenuating sound waves (in particular, ultrasonic waves) propagating from the side surfaces of adjacent piezoelectric columns as well as supporting the piezoelectric columns in sideways.

On the other hand, in order to improve the precision of an electronic device using a piezoelectric material, the piezoelectric columns need to be densely formed. In the case of forming holes in a synthetic resin mold or a polymer mold, there is a problem that it is difficult to densely form vertical holes.

Further, since a piezoelectric material is charged into the holes with the closed bottom, there is a problem that the holes are poorly filled with the piezoelectric material due to the air pressure within the mold. This problem can be solved to some extent by completely purging the air from the mold by using a vacuum pump and then charging a piezoelectric material into the holes at a vacuum pressure. However, this method has a problem of a complicated process.

In the case of using a semiconductor substrate to form piezoelectric columns, holes are first formed on a semiconductor device by using a semiconductor device manufacturing process (specifically, photolithography process), the holes are filled with a piezoelectric material, and the semiconductor substrate is replaced with an insulating member (for example, an epoxy member).

This method requires a separate hole forming process, and a complicated substrate replacing process in which the semiconductor substrate used for forming holes and filling the holes with a piezoelectric material is replaced with an insulating material. When the semiconductor substrate is not completely removed in the substrate replacing process, there is a problem that performance of the resulting electronic device is deteriorated.

DOCUMENTS OF RELATED ART

Patent Document (Patent Literature 1) Korean Patent No. 10-1288178
(Patent Literature 2) Japanese Patent No. 2617584
(Patent Literature 3) Japanese Patent No. 1996-012181

BACKGROUND OF THE DISCLOSURE

The present disclosure has been made in view of the problems occurring in the related art and an object of the present disclosure is to provide an electronic device using a piezoelectric material, the device having high recognition precision for a three-dimensional shape and improved durability.

Another object of the present disclosure is to provide a method of manufacturing a piezoelectric material-based electronic device having high recognition precision for a three-dimensional shape and improved durability.

In order to accomplish the objects of the present disclosure, there is provided a piezoelectric material-based electronic device including: an anodic oxide film; a first electrode provided on an upper surface of the anodic oxide film; a second electrode provided on an a lower surface of the anodic oxide film; and a piezoelectric column made of a piezoelectric material and provided between the first electrode and the second electrode, in which the piezoelectric column is embedded in a through hole vertically extending from the upper surface to the lower surface of the anodic oxide film so as to be surrounded by the anodic oxide film.

The electronic device may further include a conductive column provided between the first electrode and the second electrode.

The conductive column may be embedded in a through hole vertically extending from the upper surface to the lower surface of the anodic oxide film so as to be surrounded by the anodic oxide film.

The piezoelectric material-based electronic device may be a three-dimensional shape recognizing device.

The three-dimensional shape recognizing device may be a fingerprint sensor.

The piezoelectric material-based electronic device may be a sound wave transmitting device or a sound wave receiving device.

The piezoelectric material-based electronic device may be a speaker device.

In order to accomplish the objects of the present disclosure, there is provided a method of manufacturing a piezoelectric material-based electronic device, the method including: preparing an anodic oxide film; forming at least one through hole extending from an upper surface to a lower surface of the anodic oxide film; filling at least one of the through holes with a piezoelectric material to form a piezoelectric column; forming a first electrode on the upper surface of the anodic oxide film; and forming a second electrode on the lower surface of the anodic oxide, in which the piezoelectric column is disposed between the first electrode and the second electrode.

The forming of the through hole may be a process of locally etching the anodic oxide film.

The method may further include forming a conductive column by filling another through hole of the through holes with a conductive material, wherein the conductive column connects at least one of the first electrodes to at least one of the second electrodes.

As described above, the piezoelectric material-based electronic device according to the present disclosure has high recognition precision for a three-dimensional shape and improved durability.

In addition, the piezoelectric material-based electronic device according to the present disclosure can be mounted on a control chip or a printed circuit board using a flip-chip mounting technique.

The manufacturing method of the piezoelectric material-based electronic device according to the present disclosure is advantages of facilitating filling holes with a piezoelectric material to form piezoelectric columns, simplifying the manufacturing method, and enabling an electronic device having improved recognition precision and durability.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE DISCLOSURE

Figure 1:
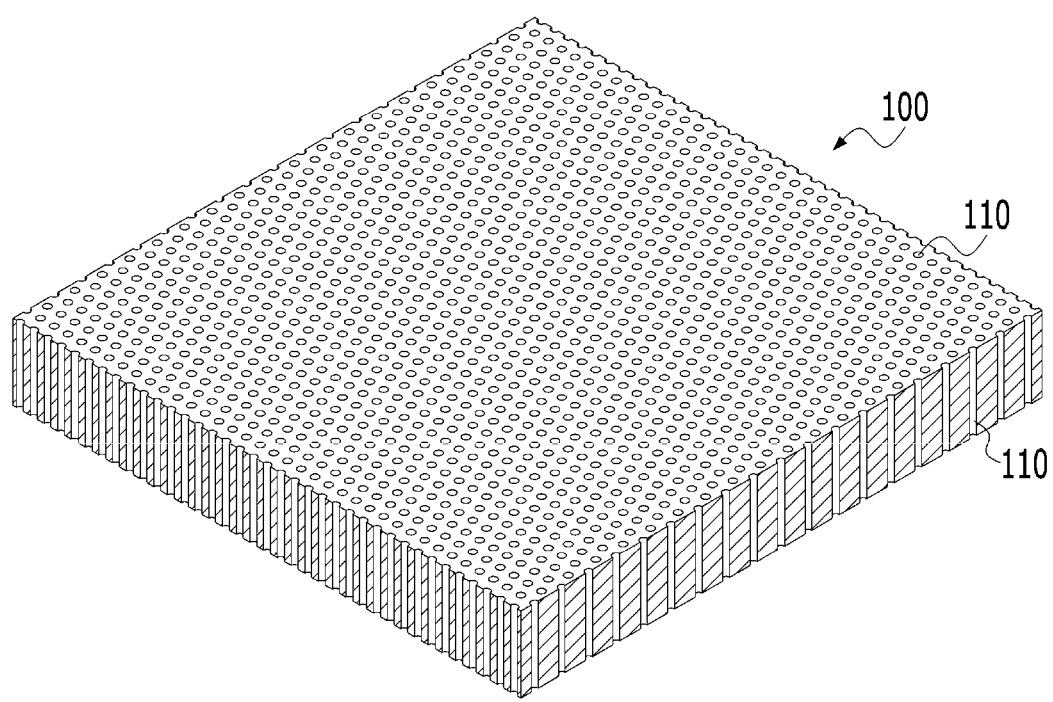
FIGS. 1 to 5 are diagrams illustrating a method of manufacturing a piezoelectric material-based electronic device according to a preferred embodiment of the present disclosure.

The description provided below presents the principles of the invention. Therefore, those skilled in the art will be able to devise various apparatuses which, although not explicitly described or shown herein, employ the principles of the invention and fall within the concept and scope of the invention by referring to the following description regarding the principles of the invention. It is also to be understood that all technical terms and embodiments recited in this specification are, in principle, intended only to enable the inventive concept to be understood and are not to be construed as limiting the scope of the invention.

The above and other objects, features and advantages of the present invention will become more apparent from the following detailed description taken in conjunction with the accompanying drawings. Accordingly, those skilled in the art can easily embody the technical ideas of the present invention.

Hereinafter, a piezoelectric material-based electronic device and a manufacturing method thereof according to preferred embodiments of the present disclosure will be described below with reference to the accompanying drawings.

A piezoelectric material-based electronic device according to a preferred embodiment of the present disclosure includes an anodic oxide film 100, a first electrode 200 formed on the upper surface of the anodic oxide film 100, a second electrode 300 formed on the lower surface of the anodic oxide film 100, and a piezoelectric column made of a piezoelectric material and provided between the first electrode and the second electrode.

Unlike conventional arts in which a synthetic resin, a polymer material (polymer), epoxy, or the like is used, an electronic device using a piezoelectric material, according to a preferred embodiment of the present invention, differs in that an anodic oxide film 100 is employed. Hereinafter, the anodic oxide film 100 constituting the electronic device using a piezoelectric material, according to a preferred embodiment of the present invention, will be described in detail with reference to FIG. 1.

A method of manufacturing the anodic oxide film 100 includes anodizing a metal and removing the metal.

The anodic oxide film 100 refers to a film formed by anodizing a metal serving as a base material. In addition, pores 110 refer to holes that are formed during the process of anodizing the metal to form the anodic oxide film 100. The pores are regularly arranged.

When the base metal is aluminum (Al) or an aluminum alloy, an anodic oxide film 100 made of anodic aluminum oxide ($Al_2O_3$) is formed on the surface of the base material through anodic oxidation of the base material. The anodic oxide film 100 formed as described above is divided into a barrier layer in which the pores 110 are not formed and a porous layer in which the pores 110 are formed. The barrier layer is located on the upper surface of the base material, and the porous layer is located on the upper surface of the barrier layer.

When the base material is removed from the structure in which the anodic oxide film 100 including the barrier layer and the porous layer is formed on the base material, only the anodic oxide film 100 made of anodic oxide aluminum (Al$_2$O$_3$) remains. After the barrier layer is removed, as illustrated in FIG. 1, the anodic oxide film 100 made of anodic oxide aluminum (Al$_2$O$_3$) remains. At this time, the anodic oxide film 100 has the pores 110 that are regularly arranged and each of which vertically extends from the upper surface to the lower surface of the anodic oxide film.

The pores 110 formed to extend through the anodic oxide film 100 in a thickness direction are separated from each other. In other words, in the anodic oxide film 100 made of anodic aluminum oxide (Al$_2$O$_3$), numerous pores 110 having a width of several to several hundreds of nm in are formed to vertically pass through the anodic oxide film 100 from the upper surface to the lower surface.

In order to increase the density of the electronic devices using a piezoelectric material, the piezoelectric columns 400 need to be densely arranged. To this end, the width of each of the piezoelectric columns 400 needs to be small, and the line width of each of the first and second electrodes 200 and 300 need to be small. When the widths of the first and second electrodes 200 and 300 are small, heat is generated in the first and second electrodes 200 and 300. The heat causes the thermal deformation of the adjacent piezoelectric columns. The piezoelectric column 400 recognizes an image of a three-dimensional shape by measuring a sound wave reflected from the three-dimensional shape. Therefore, when the thermal distortion of the piezoelectric column 400 is caused by the heat introduced from the surroundings, the accuracy of the image signal for the three-dimensional shape is deteriorated.

However, according to the preferred embodiment of the present invention, even though the first and second electrodes 200 and 300 are formed to have a fine line width, since each of the piezoelectric columns is surrounded by the anodic oxide film 100 having the many pores 110, which serves as a heat insulating member, thermal deformation of the adjacent piezoelectric columns 400 can be minimized. Thus, it is possible to prevent the noise attributable to the thermal deformation of the piezoelectric columns 400.

Figure 2:
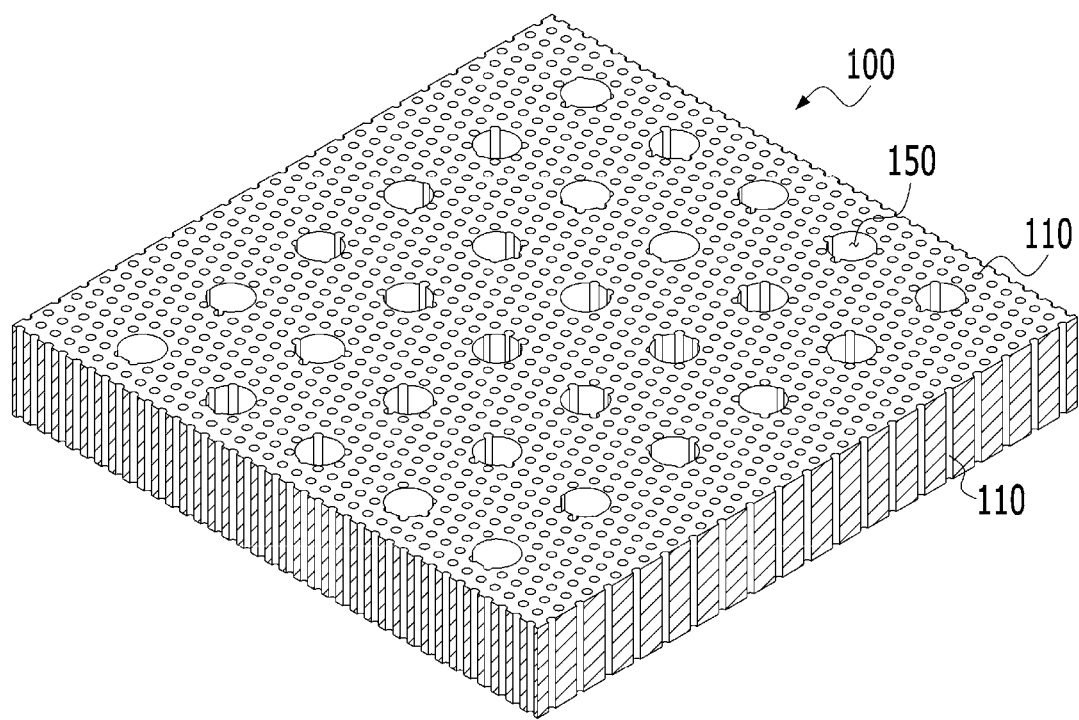

Next, as illustrated in FIG. 2, through holes 150 are formed in the anodic oxide film 100 in addition to the pores 110 that naturally occur while the base metal material is anodized. Each of the through holes 150 is configured to extend through the anodic oxide film 100 in a thickness direction, i.e., from the upper surface to the lower surface.

Each of the through holes 150 is formed by locally etching the anodic oxide film 100. That is, the anodic oxide film 100 is partially masked and only the unmasked regions are etched away to form the through holes 150. The etching produces the through holes 150 having a size larger than the pores 110. During the etching, an etching solution reacts with the anodic oxide film 100 to form the through holes vertically extending through the anodic oxide film 100 from the upper surface to the lower surface. As described above, both the pores 110 and the through holes 150 are vertical holes provided in parallel with each other within the anodic oxide film 100.

Figure 3:
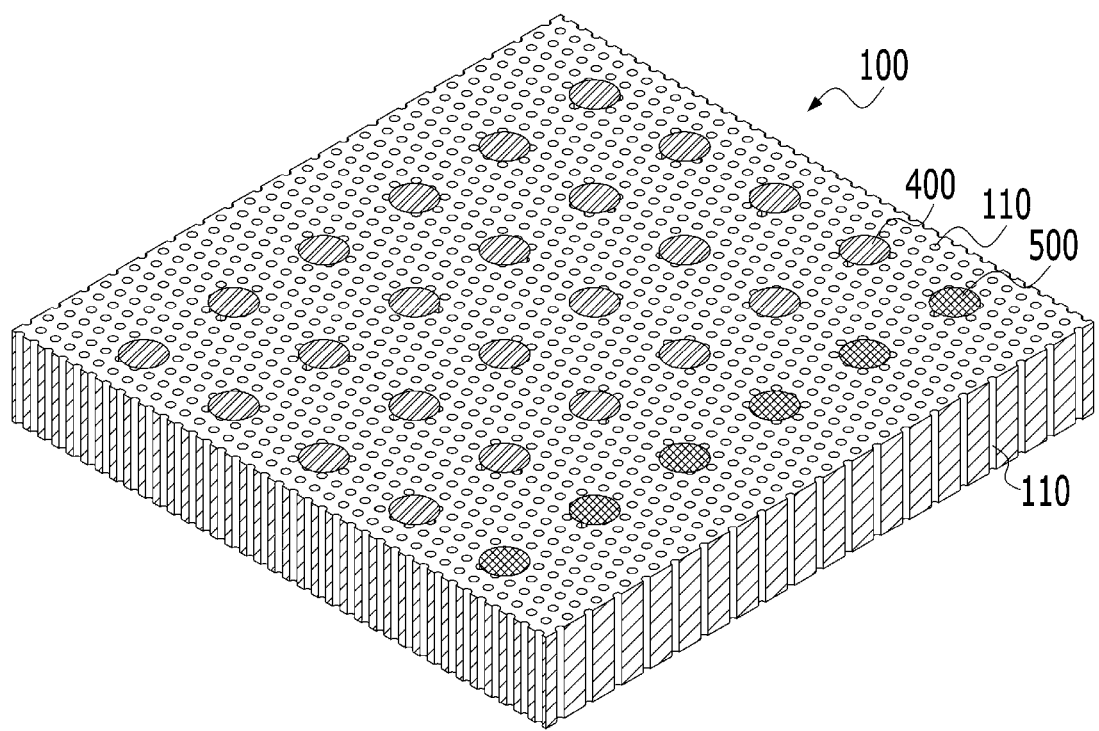

Next, as illustrated in FIG. 3, a piezoelectric material is charged into some of the through holes 150. Piezoelectric materials are materials that convert mechanical forces into electrical signals or convert electrical signals into mechanical forces. For example, lead titanate (PbTiO$_3$), barium titanate (BaTiO$_3$), and lead titanate zirconate (PZT) are piezoelectric materials.

Unlike a conventional technology in which holes in an anodic oxide film are not completely filled with a piezoelectric material due to air pressure because the piezoelectric material is charged into the through holes in a state in which the bottom of a mold is closed, the present invention employs a technology in which a piezoelectric material is charged into the through holes vertically passing through the anodic oxide film 100. Therefore, according to the present invention, it is easy to fill the through holes with the piezoelectric material.

Further, since the through holes 150 are formed to extend through the anodic oxide film from the upper surface to the lower surface of the anodic oxide film 100, a vacuum pump for sucking air from one surface of the anodic oxide film 100 is provided to form a negative pressure within the through holes 150. This facilitates introduction of the piezoelectric material into the through holes 150. Since the through holes 150 are completely filled with the piezoelectric material, the uniformity of the piezoelectric columns 400 is improved and the durability thereof is also improved.

After the piezoelectric material is charged into some of the through holes 150, the piezoelectric material is subjected to rapid thermal annealing. This rapid thermal annealing sinters the piezoelectric material to form the piezoelectric columns 400. When the piezoelectric material charged into the through holes 150 is sintered, the shape of each of the through holes 150 is maintained. Therefore, through this process, the piezoelectric material forms the piezoelectric columns having the same shape as the through holes 150. The rapid thermal annealing is performed under conditions in which the anneal temperature ranges from 850° C. to 1000° C. and the annealing time ranges from 1 minute to 20 minutes.

The piezoelectric columns 400 are configured to fill the through holes 150 vertically passing through the anodic oxide film 100. Therefore, each of the piezoelectric columns 400 is surrounded by the anodic oxide film 100 having the numerous pores 110. Since the anodic oxide film 100 is electrically insulative, an additional insulating layer for insulating the first and second electrodes 200 and 300 is not required. In addition, since the ultrasonic waves generated on the side surfaces of the respective piezoelectric columns 400 are attenuated by the adjacent piezoelectric columns, the noise attributable to the adjacent piezoelectric columns 400 can be effectively removed.

Next, a conductive material is charged into the remaining through holes 150 which are not filled with the piezoelectric material. To charge a conductive material into the remaining through holes 150, a sputtering method employing a mask or an atomic layer deposition (ALD) method may be used. However, when filling the through holes 150 with a conductive material, any other method that can charge a conductive material into the through holes 150 can be used. Since the conductive material is deposited to conform to the shape of the through holes 150 that are vertical holes, conductive columns 500 having a vertical pillar shape are formed. Each of the conductive columns 500 connects at least one of the first electrodes 200 to at least one of the second electrodes 300.

Since the first electrodes 200 provided on the upper surface of the anodic oxide film 100 can be connected with the second electrodes provided on the lower surface of the anodic oxide film 100 via the conductive columns 500, the flip chip bonding that does not require a bonding process can be performed when electrically connecting the piezoelectric material-based electronic device to a printed circuit board, a control chip, or the like.

The conductive columns 500 are configured to fill the through holes 150 vertically passing through the anodic oxide film 100. Therefore, each of the conductive columns 400 is surrounded by the anodic oxide film 100. The anodic oxide film 100 having the numerous pores 110 has a heat insulating function to prevent transverse heat transfer. Accordingly, since the anodic oxide film 100 prevents the heat generated in the conductive columns 500 from being transferred in a transverse direction, thermal deformation of the adjacent piezoelectric columns 400 is prevented. Therefore, the noise attributable to the thermal deformation of the piezoelectric columns is prevented.

In addition, since both the piezoelectric columns 400 and the conductive columns 500 are provided in the through holes 150 vertically passing through the anodic oxide film 100 from the upper surface to the lower surface of the anodic oxide film such that each of them is wrapped by the anodic oxide film 100, it is possible to minimize lateral deformation of the piezoelectric columns 400 and the conductive columns 500. That is, it is possible to prevent a decrease in lateral strength, thereby improving durability of the electronic devices and enabling miniaturization of the electronic devices.

The piezoelectric columns 400 and the conductive columns 500 are arranged in an array of m rows×n columns. Referring to FIG. 3, the piezoelectric columns 400 are arranged in an array of 6 rows×4 columns, and the conductive columns 500 are arranged in one row on the rightmost side. Thus, the all columns including the piezoelectric columns 400 and the conductive columns 500 are arranged as a whole in an array of 6 rows×5 columns.

As an alternative to the configuration in which the conductive columns 500 are arranged in one row on the rightmost side, although not illustrated in the drawings, the conductive columns 500 can be disposed within the array of piezoelectric columns 400. With this configuration, the length of each of the first electrodes 200 formed on the upper surface of the anodic oxide film to connect the upper ends of the piezoelectric columns part 400 with a corresponding conductive column 500 of the multiple conductive columns can be reduced. Thus, a voltage drop across each of the first electrodes is reduced.

Further alternatively, although not illustrated in the drawings, one conductive column 500 may be arranged on the left side of one row of the piezoelectric columns 400 and the next conductive column 500 may be arranged on the right side of the next row of the piezoelectric columns 400. In other words, the conductive pillars 500 are divided into a first group of conductive columns corresponding to the respective odd-numbered rows of the piezoelectric columns 400 and a second group of conductive columns corresponding to the respective even-numbered rows of the piezoelectric columns 400. The conductive columns in the first group may be disposed on a first side (for example, left side) of the array of piezoelectric columns 400 and the conductive columns in the second group may be disposed on a second side (for example, right side) of the array of piezoelectric columns 400. With the configuration described above, it is possible to control the multiple piezoelectric columns 400 row by row (or column by column).

Although not illustrated in the drawings, each of the first electrodes may correspond to multiple conductive columns 500. Although any one of the conductive columns 500 malfunctions, it is possible to prevent the malfunctioning of the piezoelectric material-based electronic devices.

Figure 4:
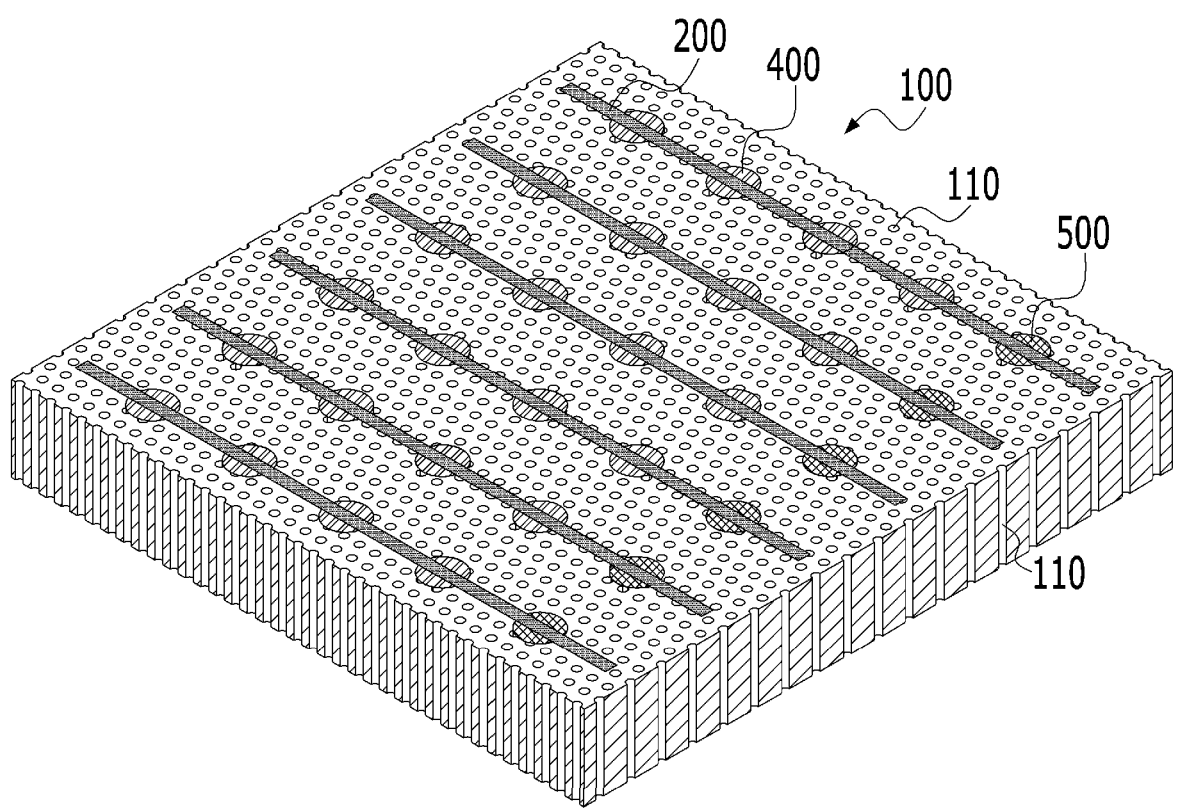
Figure 5:
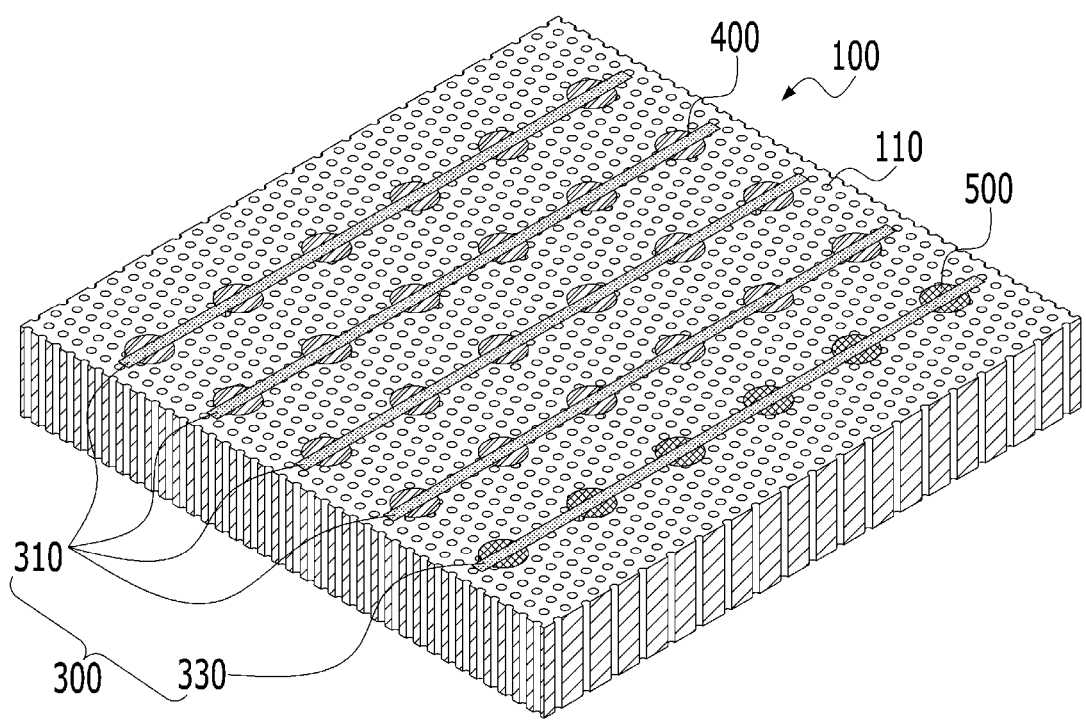

Referring to FIGS. 4 and 5, the first and second electrodes 200 and 300 are provided on the upper surface and the lower surface of the anodic oxide film 100, respectively and are arranged to intersect with each other. For example, when the first electrodes 200 extend on the upper surface of the anodic oxide film 100 in a widthwise direction, the second electrodes 300 extend on the lower surface of the anodic oxide film 100 in a lengthwise direction. The piezoelectric columns 400 filled with a piezoelectric material are disposed to extend from a corresponding one of the first electrodes 200 to a corresponding one of the second electrodes 300 and the conductive columns 400 filled with a conductive material are disposed to extend from a corresponding one of the first electrodes 200 to a corresponding one of the second electrodes 300.

The first electrodes 200 and the second electrodes 300 are formed on the surfaces of the anodic oxide film through a sputtering process. The first and second electrodes 200 and 300 is made of a pure metal selected from among Pt, W, Co, Ni, Au, and Cu, or a metal mixture including at least any one of Pt, W, Co, Ni, Au, and Cu.

Referring to FIG. 4, the first electrodes 200 are formed on the surface of the anodic oxide film 100. The number of the first electrodes 200 may be more than one. The multiple first electrodes 200 are spaced from each other. As illustrated in the drawings, the piezoelectric columns 400 and the conductive columns 500 are arranged as a whole in an array of 6 rows and 5 columns. Each of the first electrodes 200 is formed to be in contact with the upper ends of the piezoelectric columns 400 arranged in a row direction and the upper end of a corresponding one of the conductive columns 500. Accordingly, as illustrated in FIG. 4, the number of the first electrodes is six. That is, the number of the first electrodes is the same as the number of the conductive columns 500.

FIG. 5 is a bottom view of the anodic oxide film 100 of FIG. 4. Referring to FIG. 5, the second electrodes 300 are formed on the lower surface of the anodic oxide film 100. The second electrodes 300 are arranged to intersect the first electrodes 200 with the anodic oxide film 100 interposed therebetween. The second electrodes 300 can be divided into a first group and a second group. Each of the second electrodes 310 in the first group is formed to connect the lower ends of the piezoelectric columns 400. Each of the second electrodes 330 in the second group is formed to connect the lower ends of the conductive columns 500.

Figure 6:
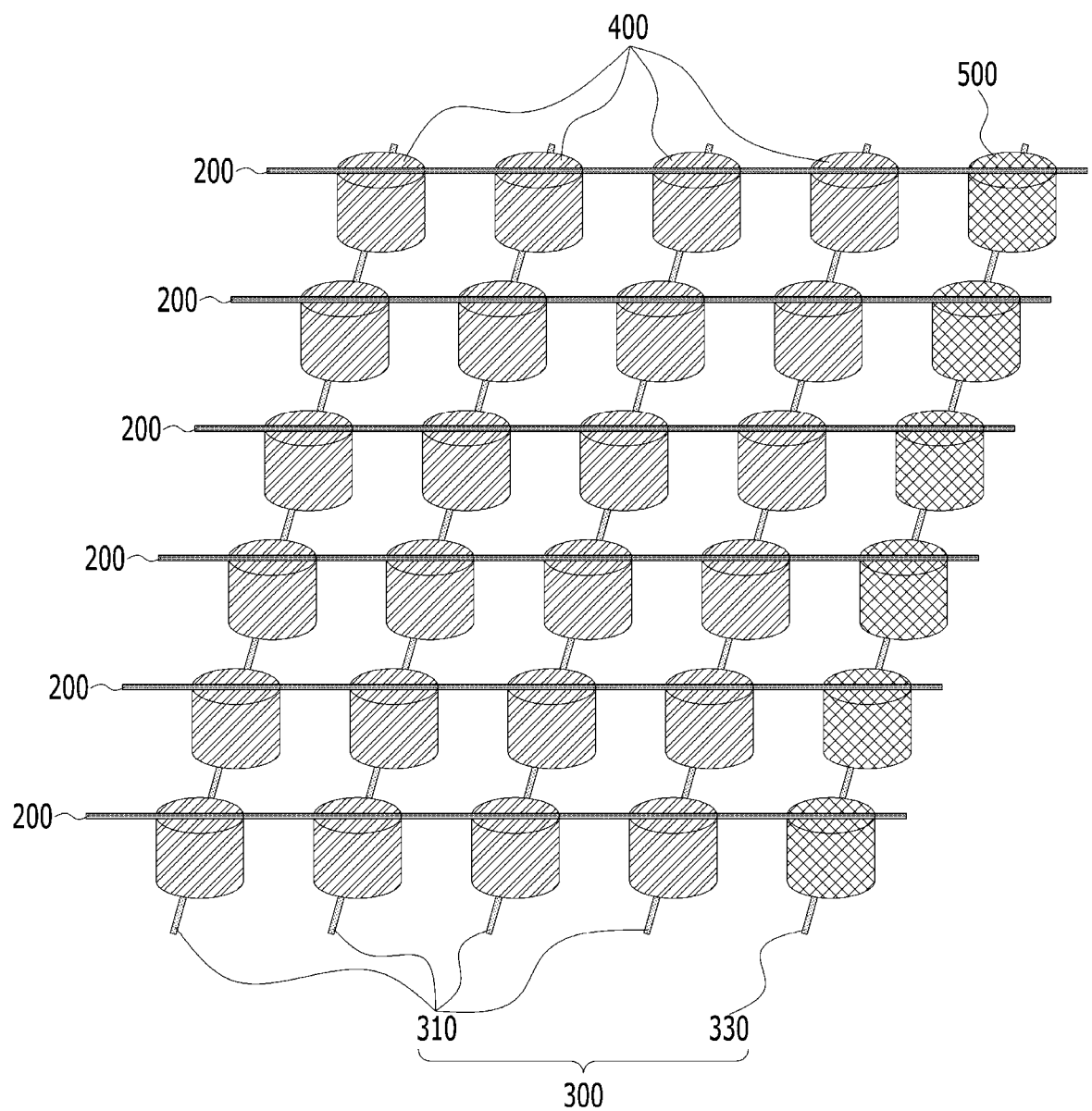
FIG. 6 is a schematic diagram illustrating the configuration of a piezoelectric material-based electronic device according to a preferred embodiment of the invention.

FIG. 6 is a schematic view of a piezoelectric material-based electronic device according to the preferred embodiment of the present invention, with the anodic oxide film 100 omitted from the illustration. As illustrated in FIG. 6, each of the piezoelectric columns 400 is provided between the first electrode 200 and the second electrode 310 belonging to the first group, and each of the conductive columns 500 is provided between the first electrode 200 and the second electrode 330 belonging to the second group.

One second electrode 330 in the second group is connected with multiple (for example, five) conductive columns 500 that are connected with multiple (for example, five) first electrodes 200, respectively. Therefore, one second electrode 330 in the second group is electrically connected with multiple electrodes 200. Accordingly, the multiple first electrodes 200 can be collectively controlled via one second electrode 330 in the second group.

With the configuration in which each of the second electrodes 330 is connected with the first electrodes 200 through the conductive columns 500, since the piezoelectric material-based electronic device can be electrically connected to a circuit board, a control chip, or the like without using a wire bonding process, there is an advantage that flip chip bonding can be used to electrically connect the piezoelectric material-based electronic device to a circuit board, a control chip, or the like.

Figure 7:
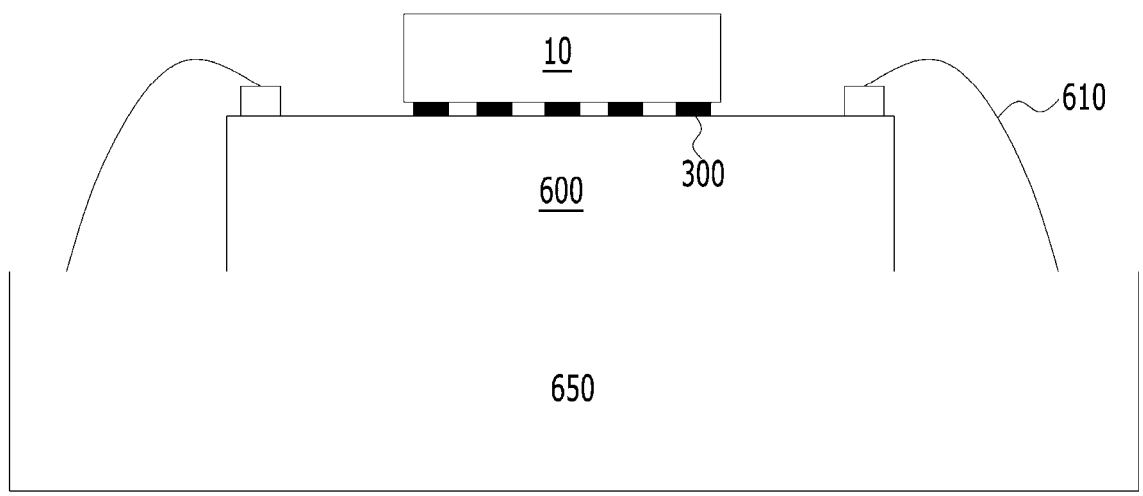
FIG. 7 is a diagram illustrating a state in which the piezoelectric material-based electronic device according to the preferred embodiment of the invention is mounted on a control chip.
Figure 8:
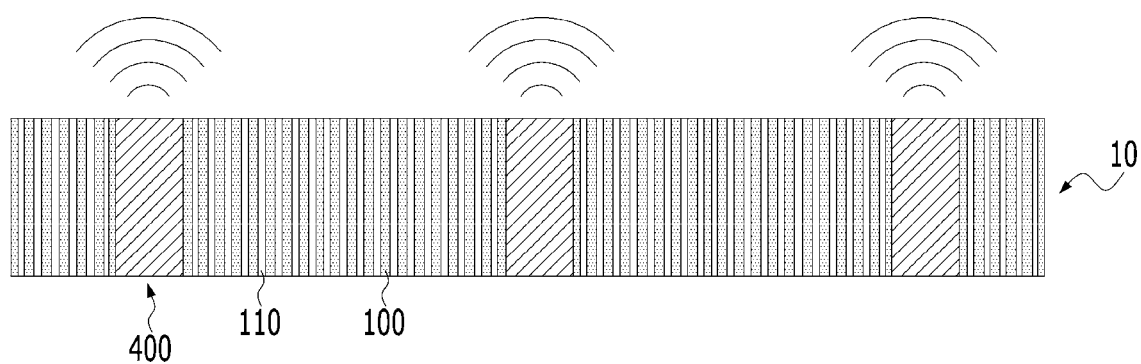
FIG. 8 is a diagram illustrating a state in which the piezoelectric material-based electronic device according to the preferred embodiment of the invention transmits a sound wave.

Referring to FIG. 7, a control chip 600 connected via a wire 610 is mounted on a circuit board 650 and a piezoelectric material-based electronic device 10 according to the preferred embodiment of the present invention is mounted on the control chip 600 through flip chip mounting. Regarding the piezoelectric material-based electronic device 10, the second electrodes 300 used for power supply to the piezoelectric columns 400 or for signal transmission from the piezoelectric columns 400 are formed on the lower side of the electronic device 10, the electronic device 10 can be flip-chip-mounted on the control chip 600. Although not illustrated in the drawings, when a controller for controlling the electronic device 10 is directly mounted on the circuit board 650, the electronic device 10 can be directly flip-chip-mounted on the circuit board 650.

As described above, since a wire for electrically connecting the electronic device 10 to the circuit board 650 or to the control chip 600 is not required, the mounting can be simplified and the electronic device 10 can be downsized.

In the above-described embodiment, the through holes 150 extending through the anodic oxide film 100 from the upper surface to the lower surface are formed, and then some of the through holes 150 are filled with the piezoelectric material to form the piezoelectric columns 400 and the remaining through holes 150 are filled with the conductive material to form the conductive columns 500. However, the invention can be implemented differently. That is, the through holes 150 are not formed in the anodic oxide film 110. Instead of forming and filling the through holes 150 with the piezoelectric material and the conductive martial, the piezoelectric material and the conductive material may be charged into the pores 110 to form the piezoelectric columns 400 and the conductive columns 500. In this case, it takes more time and incurs higher cost to fill the pores with the piezoelectric material and the conductive material than the case of forming and filling the through holes. However, this method has an advantage of eliminating a process of forming the through holes 150 by using the pores 110 of the anodic oxide film 100.

Although the pores 110 are illustrated such that they extend through the anodic oxide film from the upper surface to the lower surface, another embodiment in which barrier layers are present on the upper and lower surfaces of the anodic oxide film to close the upper and lower ends of the pores 110 is also possible. With this embodiment in which the barrier layers romaine on the surfaces of the anodic oxide film, the electrodes can be more easily formed on the barrier layers and deterioration in the strength of the anodic oxide film 110 can be prevented.

For example, the piezoelectric material-based electronic device according to the preferred embodiment of the present invention is a sound wave transmitting device in which a voltage is applied to the electrodes provided on the upper and lower ends of piezoelectric columns 400 made of the piezoelectric material to vertically vibrate the piezoelectric columns 400 to generate a sound wave. That is, the preferred embodiment of the present invention can be used to make a sound wave transmitting device.

Alternatively, for example, the piezoelectric material-based electronic device according to the preferred embodiment of the present invention may be a speaker device in which a voltage is applied to the electrodes provided on the upper and lower ends of the piezoelectric columns 400 made of a piezoelectric material to vertically vibrate the piezoelectric columns 400 to make sound. That is, the preferred embodiment of the present invention can be used to make a speaker device.

Figure 9:
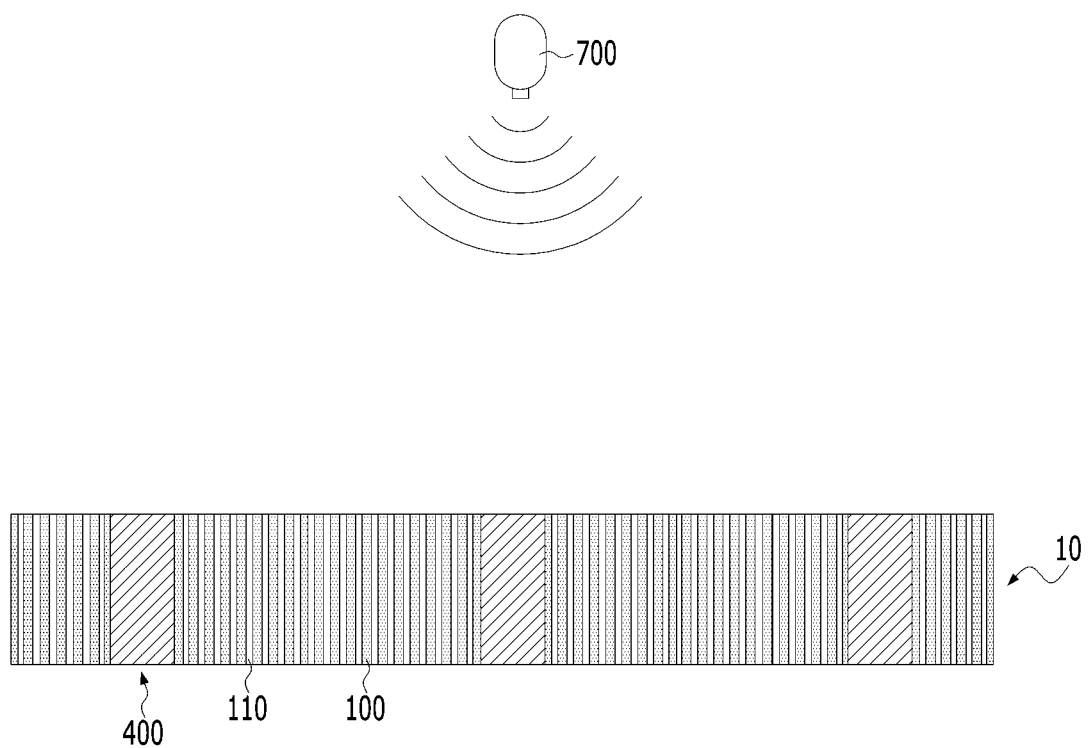
FIG. 9 is a diagram illustrating a state in which the piezoelectric material-based electronic device according to the preferred embodiment of the invention receives a sound wave.

Further alternatively, for example, as illustrated in FIG. 9, the piezoelectric material-based electronic device according to the preferred embodiment of the present invention may be a sound wave receiving device in which potential differences are generated when piezoelectric columns 400 are deformed by sound waves generated by emitters 700. That is, a sound wave receiving device can be configured by employing the preferred embodiment of the present invention.

The piezoelectric material-based electronic device according to the preferred embodiment of the present invention may be a three-dimensional shape recognition device using ultrasonic waves. That is, the preferred embodiment of the present invention can be used to make a three-dimensional shape recognition device.

Ultrasound is a sound (sound wave) with a high frequency that cannot be heard by the human ears. The frequency of the sound that a person can hear ranges from 20 and 20,000 Hz. Sound waves having a higher frequency than that are called ultrasonic waves. A voltage having a resonance frequency of an ultrasonic wave is applied to first and second electrodes 200 and 300 provided on the upper and lower surfaces of piezoelectric columns 400 made of a piezoelectric material to vibrate the piezoelectric columns 400 up and down, thereby generating an ultrasonic signal. This ultrasonic signal is transmitted to a three-dimensional object and is then reflected by the three-dimensional object. When the reflected signal (returning signal) enters the three-dimensional shape recognition device, the piezoelectric columns 400 are deformed to generate potential differences. On the basis of these potential differences, the shape of the three-dimensional object can be recognized.

At this time, the piezoelectric columns 400 transmit and receive ultrasonic waves in all directions including the transverse direction. Ultrasonic waves emitted from the side surface of the piezoelectric column 400 are likely to be directly detected by the adjacent piezoelectric columns without successfully propagating to and being reflected from the three-dimensional object, resulting in noise. However, in the case of the configuration in which the piezoelectric columns 400 provided in the through holes 150 so as to be surrounded by the anodic oxide film 100 having numerous pores 110, since the ultrasonic waves generated on the side surfaces of the piezoelectric columns 400 are attenuated by numerous air columns formed in the pores 110, noise attributable to the interference of the adjacent piezoelectric columns 400 can be effectively removed.

Figure 10:
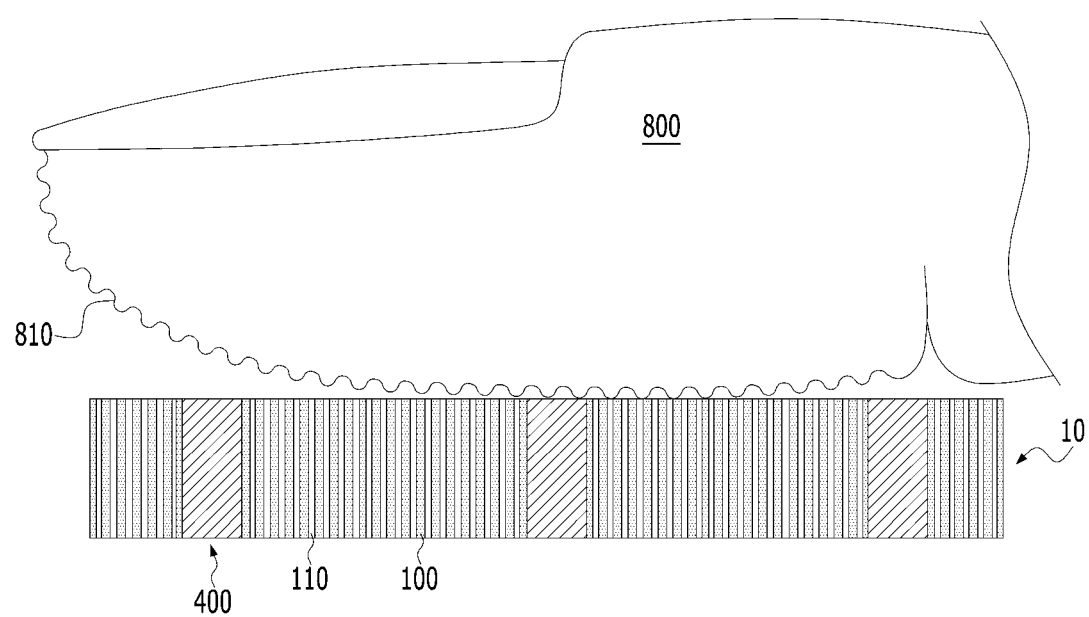
FIG. 10 is a diagram illustrating a state in which the piezoelectric material-based electronic device according to the preferred embodiment of the invention recognizes a fingerprint.

As illustrated in FIG. 10, the three-dimensional shape recognition device using ultrasonic waves may be an ultrasonic fingerprint sensor that recognizes the fingerprint 810 of a finger 800. The ultrasonic fingerprint sensor has an advantage of preventing a false fingerprint from being used because the pattern of a fingerprint is measured in three dimensions in contrast to conventional fingerprint recognition schemes (for example, an optical scheme and a capacitive scheme) in which the pattern of a fingerprint is measured only in two dimensions.

In addition, according to the preferred embodiment of the present invention, since the piezoelectric columns 400 can be formed in a small size, the three-dimensional pattern of a fingerprint can be more precisely recognized. Further, the three-dimensional shape recognition device using ultrasonic waves may be a device for identifying the three-dimensional shape of an internal organ or tissue of a human body.

While the present invention has been described with reference to exemplary embodiments thereof, it will be understood by those skilled in the art that various changes, modifications, equivalents thereto are possible without departing from the spirit and scope of the invention defined by the following claims.

What is claimed is:

1. An electronic device using a piezoelectric material, the device comprising:
    an anodic oxide film;
    a first electrode provided on an upper surface of the anodic oxide film;
    a second electrode provided on a lower surface of the anodic oxide film; and
    to a piezoelectric column made of a piezoelectric material and provided between the first electrode and the second electrode.

2. The electronic device according to claim 1, wherein the piezoelectric column is embedded in a through hole vertically extending from the upper surface to the lower surface of the anodic oxide film so as to be surrounded by the anodic oxide film.

3. The electronic device according to claim 1, wherein the electronic device further comprises a conductive column formed between the first electrode and the second electrode.

4. The electronic device according to claim 3, wherein the conductive column is embedded in a through hole vertically extending from the upper surface to the lower surface of the anodic oxide film so as to be surrounded by the anodic oxide film.

5. The electronic device according to claim 1, wherein the electronic device is a three-dimensional shape recognizing device.

6. The device according to claim 5, wherein the three-dimensional shape recognizing device is a fingerprint sensor.

7. The electronic device according to claim 1, wherein the electronic device is a sound wave transmitting device or a sound wave receiving device.

8. The electronic device according to claim 1, wherein the electronic device is a speaker device.

9. A method of manufacturing an electronic device using a piezoelectric material, the method comprising:
    preparing an anodic oxide film;
    forming at least one through hole extending from an upper surface to a lower surface of the anodic oxide film;
    forming a piezoelectric column by filling the through hole with a piezoelectric material;
    forming a first electrode on the upper surface of the anodic oxide film; and
    forming a second electrode on the lower surface of the anodic oxide,
    wherein the piezoelectric column is disposed between the first electrode and the second electrode.

10. The method according to claim 9, wherein the forming of the through hole comprises etching a region of the anodic oxide film.

11. The method according to claim 9, further comprising forming a conductive column by filling at least one of the through holes with a conductive material, wherein the conductive column connects at least one of the first electrodes with at least one of the second electrodes.

* * * * *